United States Patent
Wyse et al.

(10) Patent No.: US 8,903,342 B1
(45) Date of Patent: Dec. 2, 2014

(54) HIGH DYNAMIC RANGE PRECISION VARIABLE AMPLITUDE CONTROLLER

(71) Applicants: Russell D. Wyse, Center Point, IA (US); Michael L. Hageman, Mount Vernon, IA (US)

(72) Inventors: Russell D. Wyse, Center Point, IA (US); Michael L. Hageman, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 13/737,777

(22) Filed: Jan. 9, 2013

(51) Int. Cl.
- *H04B 1/06* (2006.01)
- *H03F 3/45* (2006.01)

(52) U.S. Cl.
CPC ........ *H03F 3/45071* (2013.01); *H03F 3/45174* (2013.01); *H03F 3/45165* (2013.01)
USPC .................. 455/234.1; 455/245.1; 455/249.1; 455/252.1; 330/257; 330/288

(58) Field of Classification Search
CPC .... H03F 3/45; H03F 3/45165; H03F 3/45174
USPC ...................... 455/234.1, 245.1, 249.1, 252.1; 330/257, 288
See application file for complete search history.

(56) References Cited

U.S. PATENT DOCUMENTS

| | | | |
|---|---|---|---|
| 2,813,247 A | 11/1957 | Decker | |
| 4,437,070 A * | 3/1984 | Horl | 330/254 |
| 5,321,746 A * | 6/1994 | Bader | 379/390.01 |
| 5,828,763 A | 10/1998 | Koyano et al. | |
| 6,684,065 B2 * | 1/2004 | Bult et al. | 455/252.1 |
| 6,998,918 B2 * | 2/2006 | Doherty et al. | 330/285 |
| 7,076,226 B2 * | 7/2006 | Bult et al. | 455/252.1 |
| 7,414,577 B2 | 8/2008 | Mohamadi | |
| 8,489,052 B2 * | 7/2013 | Bult et al. | 455/252.1 |
| 2006/0176217 A1 | 8/2006 | Lewis | |
| 2011/0080154 A1 * | 4/2011 | Yin et al. | 323/314 |
| 2012/0014278 A1 * | 1/2012 | Ameti et al. | 370/252 |

OTHER PUBLICATIONS

Attenuator (electronics), en. wikipedia.org/wiki/Attenuator_(electronics), Nov. 14, 2012, 5 pages.
Circulator, en.wikipedia.org/wiki/Circulator, retrieved Dec. 5, 2012, 3 pages.
Digital Step Attenuators Offer Precision and Linearity, Mini Circuits, Jun. 21, 2011, 11 pages.
Digital-to-Analog Converter, en.wikipedia.org/wiki/Digital-to-analog_converter, retrieved Nov. 26, 2012, 7 pages.
Fenn et al., The Development of Phased-Array Radar Technology, 2000, 20 pages.

(Continued)

*Primary Examiner* — Duc M Nguyen
(74) *Attorney, Agent, or Firm* — Angel N. Gerdzhikov; Donna P. Suchy; Daniel M. Barbieri

(57) ABSTRACT

A high dynamic range precision variable amplitude controller includes a gain portion configured to apply a controllable amount of amplitude adjustment to an input signal. The gain portion includes two or more amplification stages each amplification stage having branches that are cross-coupled with branches of the other amplification stage. A control portion controls the current supply to the two or more amplification stages to control the amount of amplitude adjustment by the gain portion. The amplitude controller also includes a load portion that provides balanced impedances to the cross-coupled branches of the amplification stages throughout the amplitude control range.

20 Claims, 5 Drawing Sheets

(56) References Cited

OTHER PUBLICATIONS

Gilbert Cell UHF Transistor Array, Intersil, Sep. 2004, 12 pages.
Hopkins et al., Aperture Efficiency of Amplitude Weighting Distributions for Array Antennas, 9 pages.
Koh et al., A Millimeter-Wave (4001345 GHz) 16-Element Phased-Array Transmitter in 0.18-um SiGe BiCMOS Technology, May 2009, 12 pages.
Koh et al., A Q-Band Four-Element Phased-Array Front-End Receiver with Integrated Wilkinson Power Combiners in 0.18-um SiGe BiCMOS Technology, Sep. 2008, 8 pages.
LMX2216 0.1 GHz to 2.0 GHz Low Noise Amplifier/Mixer for RF Personal Communications, National Semiconductor, Aug. 1995, 12 pages.
Nickel, Fundamentals of Signal Processing for Phased Array Radar, 2006, 22 pages.
Phase (waves), en.wikipedia.org/wiki/ Phase_(waves), retrieved on Nov. 26, 2012, 5 pages.
Phased Array Antennas, http://www.microwaves101.com/encyclopedia/phasedarrays.cfm, retrieved Nov. 20, 2012, 6 pages.
Ta et al., A Millimeter-Wave Phase Shifter on CMOS for Beamforming Applications, Jul. 2008, 4 pages.

* cited by examiner

HIGH DYNAMIC RANGE PRECISION VARIABLE AMPLITUDE CONTROLLER

BACKGROUND

The present disclosure relates generally to variable amplitude controllers, such as variable gain amplifiers and variable attenuators. More particularly, the present application relates to a variable amplitude controller having a high degree of gain variation with minimal insertion phase modulation.

Variable amplitude controllers are used in a variety of applications ranging from speaker systems to wireless communication systems. In radio and other high-frequency applications, amplitude controllers are used to control the amplitude of a transmitted or received signal. In many of these applications, a variable amplitude controller is used to allow variable control over the degree of attenuation or gain provided by the amplitude controller.

Variable amplitude controllers generally fall into two categories: digital amplitude controllers and analog amplitude controllers. A digital amplitude controller operates in a step-like manner and allows for the amount of gain or attenuation to be controlled subject to minimum attenuation or gain step. Such a digital amplitude controller may receive n-number of bits to control the amount of gain or attenuation applied to an input signal. Each bit ranging from the least-significant bit (LSB) of the control signal to the most-significant bit (MSB) of the control signal may apply a greater amount of attenuation or gain to the input signal. For example, the smallest amount of attenuation or gain that a particular digital amplitude controller may apply is –0.5 decibels (dB) of attenuation from the LSB, followed by 1 dB of attenuation for the next bit, followed by 2 dB of attenuation for the bit after that, etc. A variable analog amplitude controller, in contrast, offers the potential for a continuous range of control over the attenuation or gain applied to a signal. However, all devices that adjust the amplitude of a signal will also apply a certain amount of insertion phase shift to the amplitude-adjusted signal by virtue of their operation, due to non-ideal circuit realities such as imperfect circuit element interaction with parasitic stray capacitance across the amplitude control range. Accordingly, applicants have discovered that there may be a need for an analog amplitude controller that exhibits a minimal phase shift while supporting a wide range of amplitude control.

SUMMARY

One embodiment of the present disclosure relates to an amplitude controller for providing minimal phase alteration across an amplitude control range. The amplitude controller includes a gain portion configured to receive an input signal, to apply a controllable amount of amplitude adjustment to the input signal across the amplitude control range, and to provide an amplitude-adjusted form of the input signal as an output signal. The gain portion includes two amplification stages, each amplification stage having branches that are cross-coupled with branches of the other amplification stage. Each amplitude controller also includes a current mirror portion configured to control the amount of amplitude adjustment applied by the gain portion by providing control currents to the amplification stages. A maximum of the amplitude control range corresponds to current being supplied to one of the amplification stages and a minimum of the amplitude control range corresponding to equal currents being supplied to the two cross-coupled amplification stages. The amount of amplitude adjustment is varied between the minimum and maximum of the amplitude control range by increasing the current to one of the cross-coupled amplification stages while decreasing the current to the other amplification stage in an equal amount. Each amplitude controller also includes a load portion connected to the two amplification stages and configured to provide balanced impedances to the cross-coupled branches of the amplification stages throughout the amplitude control range.

Another embodiment of the present disclosure relates to an electronically scanned antenna array. The array includes a plurality of antenna elements configured to transmit a beam comprising signals emitted by the antenna elements. The array also includes a plurality of amplitude controllers configured to adjust the amplitudes of signals provided to the antenna elements for emission. Each amplitude controller includes a gain portion configured to receive an input signal, to apply a controllable amount of amplitude adjustment to the input signal across the amplitude control range, and to provide an amplitude-adjusted form of the input signal as an output signal. The gain portion includes two amplification stages, each amplification stage having branches that are cross-coupled with branches of the other amplification stage. Each amplitude controller also includes a current mirror portion configured to control the amount of amplitude adjustment applied by the gain portion by providing control currents to the amplification stages. A maximum of the amplitude control range corresponds to current being supplied to one of the amplification stages and a minimum of the amplitude control range corresponding to equal currents being supplied to the two cross-coupled amplification stages. The amount of amplitude adjustment is varied between the minimum and maximum of the amplitude control range by increasing the current to one of the cross-coupled amplification stages while decreasing the current to the other amplification stage in an equal amount. Each amplitude controller also includes a load portion connected to the two amplification stages and configured to provide balanced impedances to the cross-coupled branches of the amplification stages throughout the amplitude control range.

A further embodiment of the present disclosure relates to an amplitude controller for providing minimal phase alteration across an amplitude control range. The amplitude controller includes gain means for applying a controllable amount of amplitude adjustment to a received input signal. The amplitude controller also includes means for controlling currents supplied to the gain means to control the amount of amplitude adjustment. The amplitude controller also includes load means providing balanced impedances to the cross-coupled branches of the amplification stages throughout the amplitude control range.

BRIEF DESCRIPTION OF THE DRAWINGS

The invention will become more fully understood from the following detailed description, taken in conjunction with the accompanying drawings, wherein like reference numerals refer to like elements, in which.

Like reference numbers and designations in the various drawings indicate like elements.

DETAILED DESCRIPTION

Referring generally to the Figures, a variable amplitude controller is disclosed. In various embodiments, the amplitude controller utilizes analog circuit elements to allow control over a continuous range of gain values. The analog circuit elements may be controlled via a digital control signal, allowing the amplitude controller to be controlled by a digital processing circuit to act like a digitally stepped amplitude controller. In some embodiments, the amplitude controller may utilize one or more transistors having a nearly linear transconductance to current relationship. The amplitude controller may also be configured to minimize or eliminate insertion phase shifts across the amplitude control range and support a wide range of input frequencies. In some embodiments, the amplitude controller may be configured such that the voltages across different branches of amplifier elements in the amplitude controller may be held equal across its amplitude control range. In cases in which the amplifier elements exhibit nearly linear transconductance to current relationships, for example, holding the voltages constant across the different branches allows for the amount of amplification or attenuation to be varied smoothly by adjusting the amount of current provided to the amplifier elements. According to various embodiments, the amplitude controller may be used in radar systems, communications systems, and other electronic systems that use electronically scanned arrays (ESAs), or other similar applications in which a high dynamic range variable amplitude controller may be used.

Figure 1A:
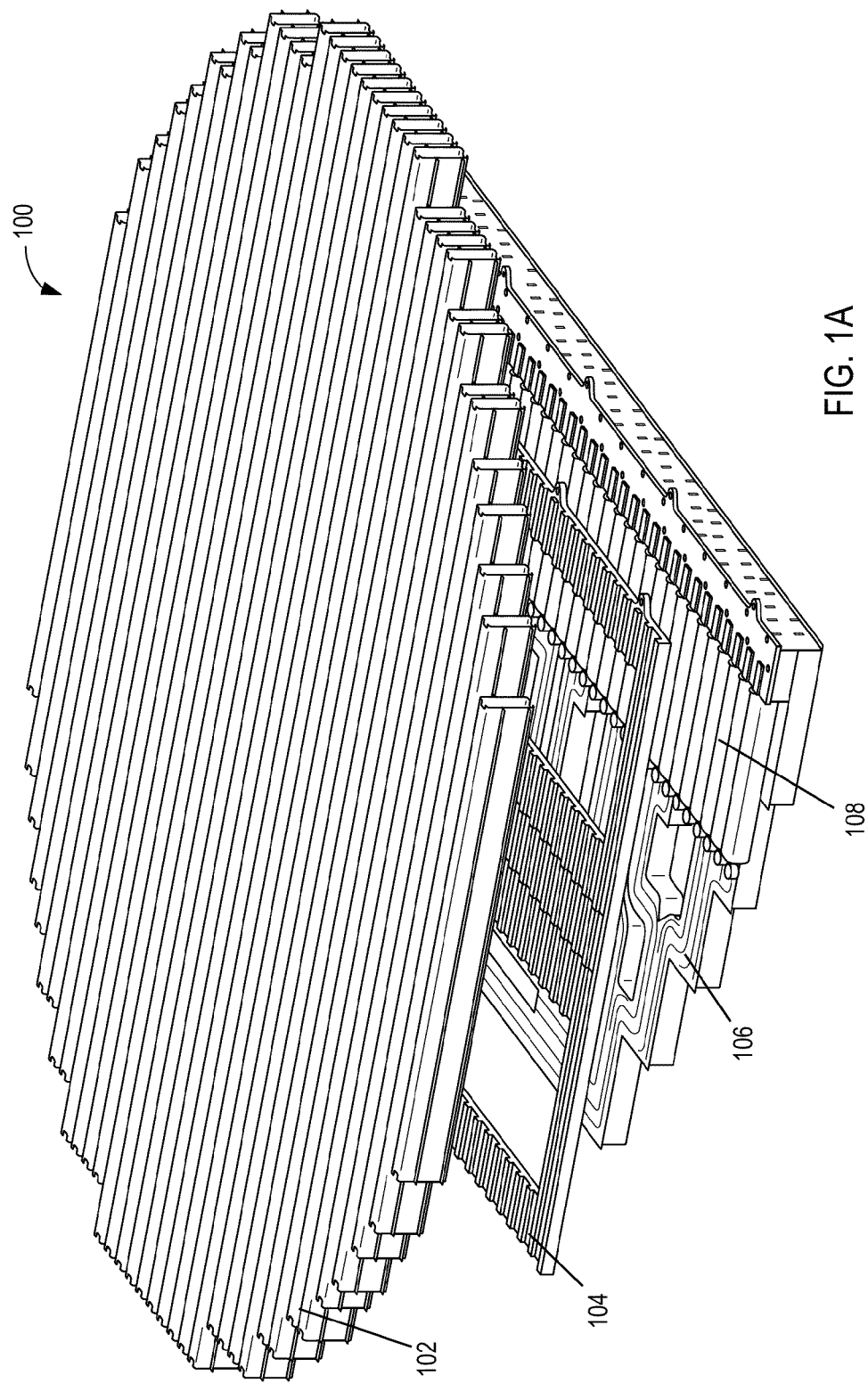
FIG. 1A is an exploded view of an electronically scanned array, according to an exemplary embodiment.

Referring now to FIG. 1A, an exploded view of an ESA 100 is shown, according to an exemplary embodiment. In one embodiment, ESA 100 is a one-dimensional antenna array (a planar 2D array that scans in one direction) and may be an edge slotted waveguide antenna. In other embodiments, ESA 100 is a multi-dimensional antenna array. Also referred to as a phased array or phased antenna array, an ESA such as ESA 100 may be configured to direct a beam in any number of different directions without mechanically altering its positions. For example, ESA 100 may be in an upright position and perform radar scans in any number of vertical or horizontal directions, without mechanically changing the orientation of ESA 100.

As shown, ESA 100 includes an array of elements 102 which function to direct radio frequency waves (e.g., microwaves, ultra-high frequency waves, etc.) away from ESA 100 or to receive radio frequency waves. In one embodiment, ESA 100 may be used in a radar system to transmit a radar beam and to receive radar returns. In other embodiments, ESA 100 may be used in a communications system to transmit or receive communication signals. For example, ESA 100 may be used in a satellite communication system to transmit data to a remote location or receive data from the remote location. ESA 100 may be of any number of different shapes or forms. For example, ESA 100 may be circular, square, rectangular, elliptical, or may be another shaped contour. ESA 100 also includes a feed manifold 106 and a mounting frame 104 for coupling elements 102 to feed manifold 106. According to an exemplary embodiment, feed manifold 106 and the array of elements 102 are easily separable, allowing for individual testing and repairing. Coupled to the array of elements 102 are transmit and receive (TR) circuits 108, which adjust the phase and amplitude of the transmitted and received signals. By controlling the phase and amplitudes of the transmitted signals, for example, the direction of the beam emitted from ESA 100 may be adjusted without having to mechanically move ESA 100.

Figure 1B:
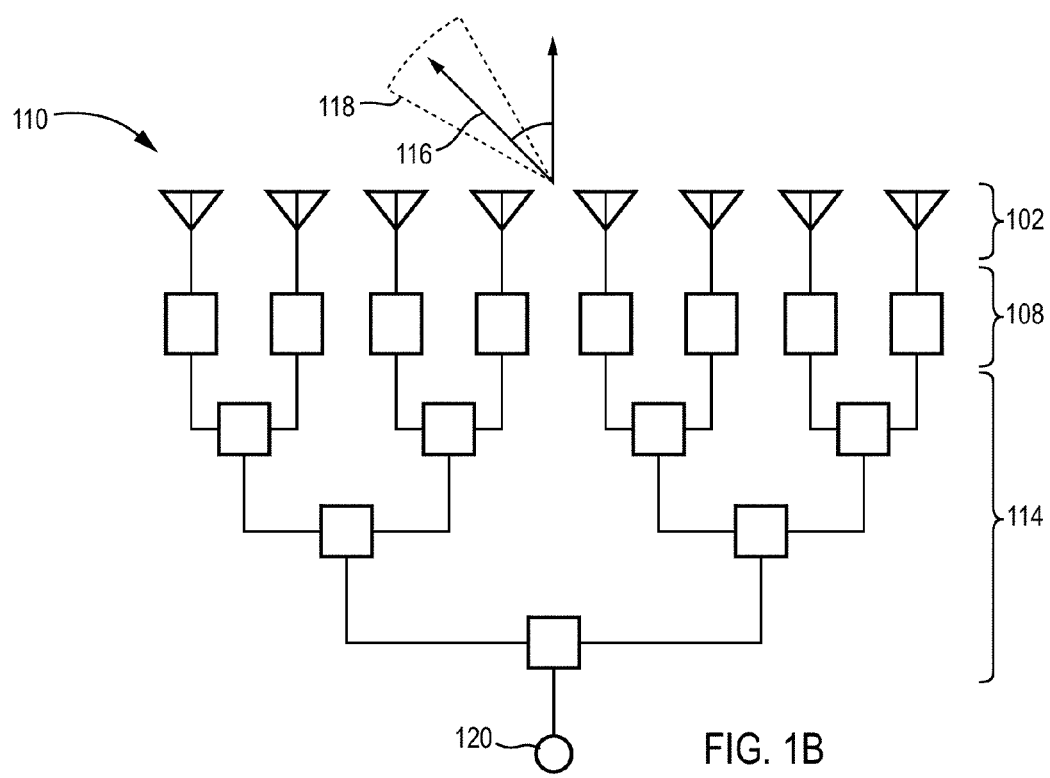
FIG. 1B is a schematic illustration of a row of elements of the electronically scanned array shown in FIG. 1A, according to an exemplary embodiment.

Referring now to FIG. 1B, a schematic illustration 110 is shown of a row of elements of the ESA 100 shown in FIG. 1A, according to an exemplary embodiment. As shown, the elements 102 of ESA 100 may be arranged in rows. According to some embodiments, each row of elements 102 may receive a signal from a signal source 120, which generates a radio frequency signal to be emitted from ESA 100 by elements 102. A power divider network 114 may divide the signal generated by signal source 120 and route the divided signals to elements 102. Coupled to elements 102 and power divider network 114 are TR circuits 108, which are configured to transmit the signals received from signal source 120 via elements 102 or route signals received from elements 102. In various embodiments, TR circuits may control the direction of a beam emitted by elements 102 by controlling the phase and amplitudes of the signals provided to the individual elements 102 by power divider network 114.

Elements 102 may be separated by a uniform distance (d), according to one embodiment. The individual signals emitted by elements 102 may combine to form a beam 116 directed along a direction 118. Beam 116 may be emitted as a broadside beam orthogonal to ESA 100 (e.g., angle θ=0) when the phase shift (φ) produced by TR circuits 108 is also zero. To direct beam 116 at a different direction, such as along direction 118, TR circuits 108 may produce phase shifts as follows:

$$\phi_n = nkd^* \sin(\theta)$$

where n is the nth element in the row of elements 102, $\phi_n$ is the phase excitation of the nth element in the row of elements 102, d is the distance between elements 102 in the row, θ is the angle of beam 116 when directed along direction 118, and k is the wave number (e.g., 2π/λ) of the emitted signal having a wavelength λ. In some embodiments, TR circuits 108 may also control the amplitudes of their respective signals, to control the resulting shape of beam 116 and its sidelobes.

Figure 2:
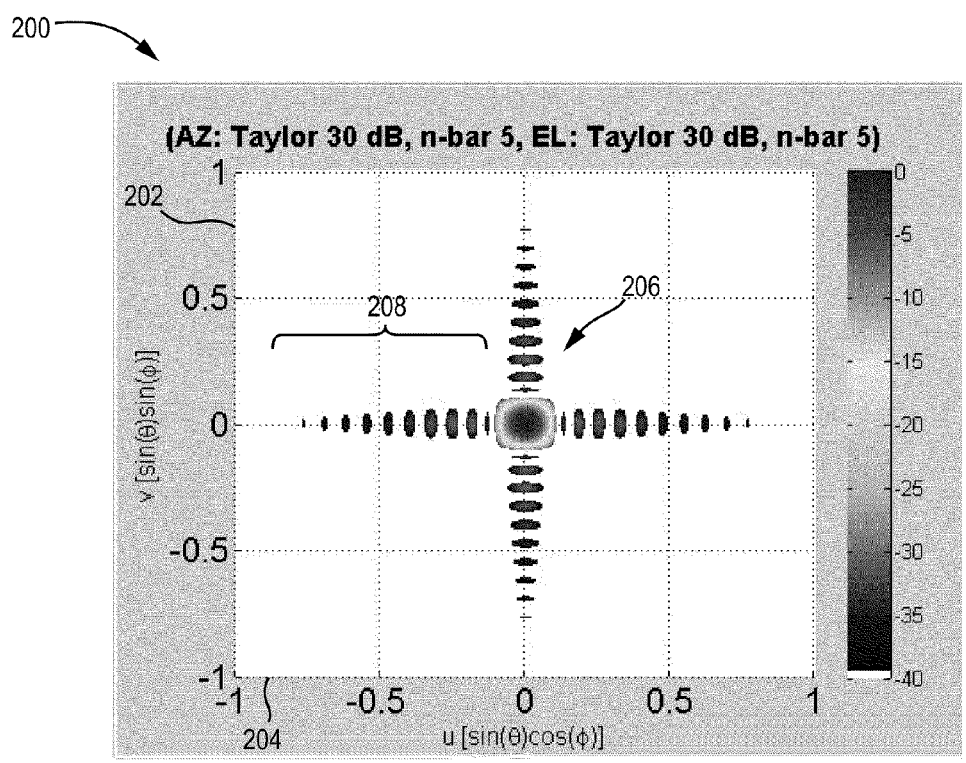
FIG. 2 is an illustration of an ideal radiation pattern for an electronically scanned array, according to an exemplary embodiment.

Referring now to FIG. 2, an illustration 200 is shown of an ideal radiation pattern for an ESA, according to an exemplary embodiment. As shown, the radiation pattern for the beam may be represented in u,v coordinates that correspond to spherical coordinates in three dimensions (e.g., a distance r, azimuth angle θ, and polar angle φ). In other words, the radiation pattern may be represented as a Q×P matrix of values u,v that represent the lengths of vectors P and Q, respectively. The magnitudes of values in the Q×P matrix are measured in decibels (dB), in one embodiment. For example, the u coordinates along axis 204 represent values ranging from −1 to 1 (e.g., the value of sin(θ)cos(φ)), while the v coordinates along axis 202 represent values ranging from −1 to 1 (e.g., the value of sin(θ)sin(φ)).

In an ideal case, the radiation pattern of an ESA includes a main beam 206 having the highest amplitude. Separated from main beam 206 are side lobes 208 (e.g., portions of the radiated signal that surround main beam 206) that result from the aperture distribution of the ESA. Also in an ideal case, the amplitudes of side lobes 208 taper off going farther away from main beam 206. In some embodiments, the amplitudes of side lobes 208 may be controlled by applying an amplitude weighting to the signals transmitted by the different elements of the ESA. In various embodiments, amplitude weightings may be applied to the signals of the different elements by variable amplitude controllers connected to the elements. Thus, amplitude weightings and phase adjustments may be used to control the direction of main beam 206 and the taper of side lobes 208.

Figure 3:
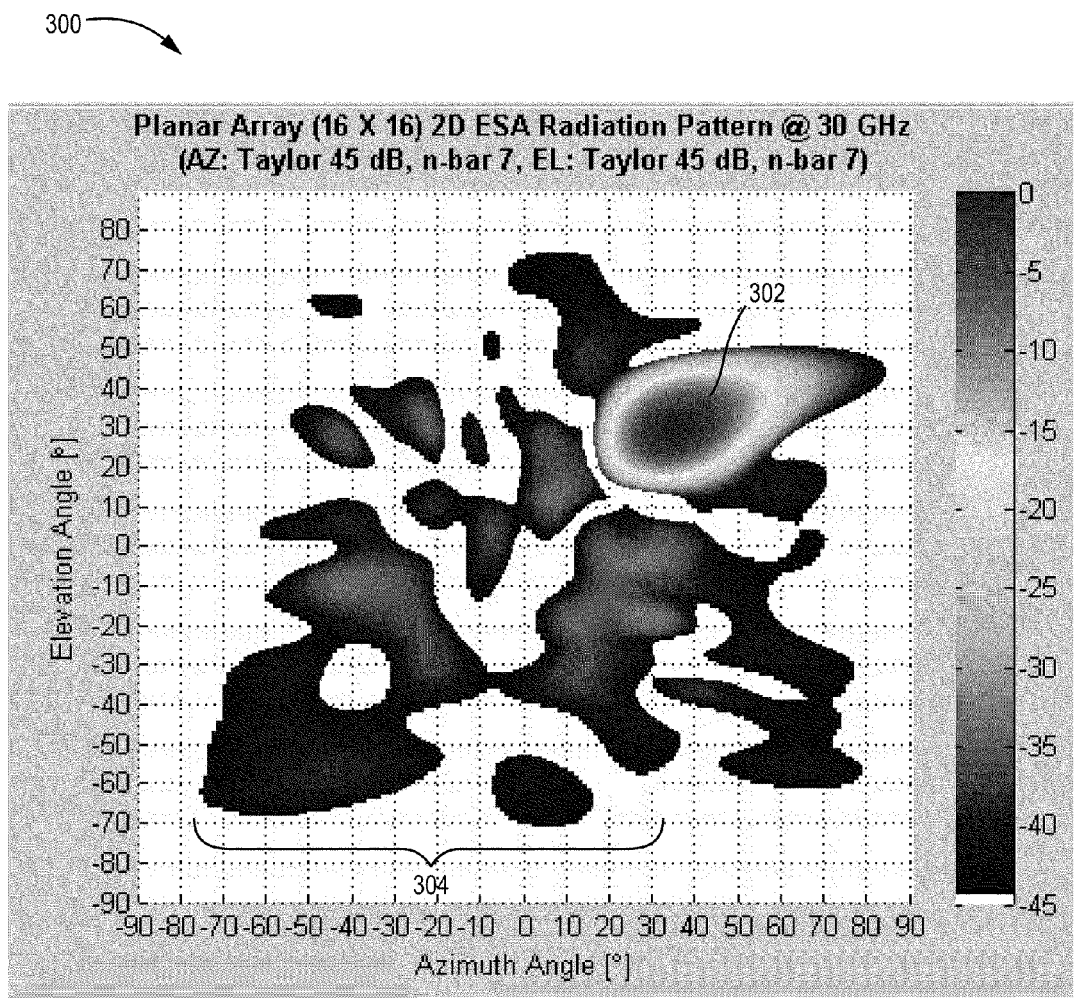
FIG. 3 is an illustration of a radiation pattern for an electronically scanned array exhibiting phase error, according to an exemplary embodiment.

Referring now to FIG. 3 an illustration 300 is shown of a radiation pattern for an ESA exhibiting amplitude and phase error, according to an exemplary embodiment. As shown, deterministic (e.g., periodic) and random errors in the amplitudes and phases of the signals emitted along the aperture of the ESA may result in radiation pattern shown in illustration 300. Unlike the ideal radiation pattern shown in FIG. 2, the amplitudes of side lobes 304 do not taper away from main beam 302. Similar to uncorrelated electrical noise, random root mean square (RMS) errors along the ESA's aperture increase the "noise" of side lobes 304, resulting in the radiation pattern shown. In some cases, the amplitude or phase errors may result from imprecise control of the ESA's phase shifters or amplitude controllers. For example, a phase shifter having a high phase swing may not be able to precisely control the phase shifts of the signals emitted by the ESA's elements, resulting in non-tapered side lobes 304. Similarly, an amplitude controller that introduces an unwanted phase shift or has a certain degree of error in its gain may result in side lobes 304.

Figure 4:
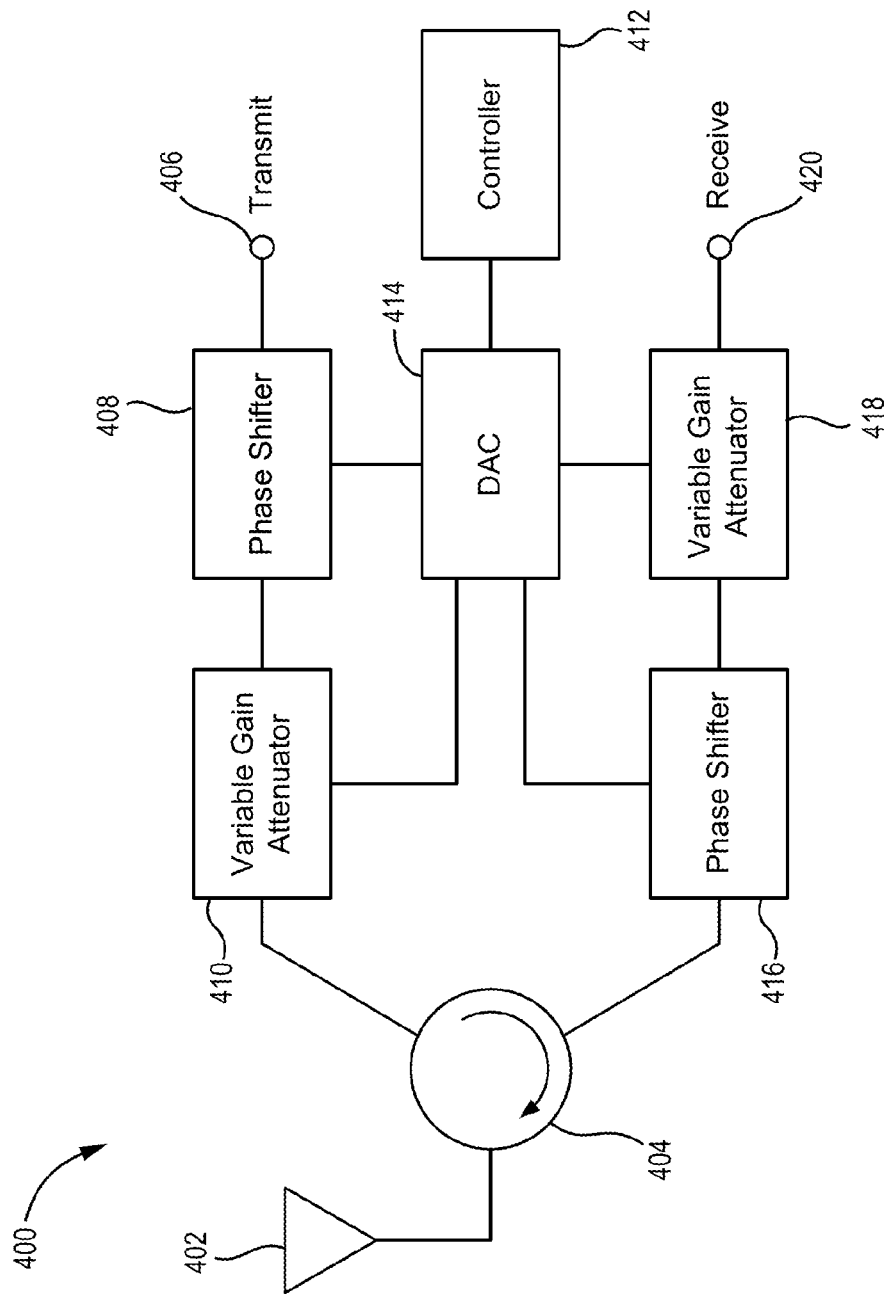
FIG. 4 is a schematic block diagram of a transmit and receive circuit of an electronically scanned array, according to an exemplary embodiment.

Referring now to FIG. 4, a schematic block diagram is shown of a TR circuit 400 of an ESA, according to an exemplary embodiment. In general, TR circuit 400 is configured to facilitate the transmitting and receiving of signals via an element 402 of the ESA. For example, TR circuit 400 may be one of TR circuits 108 shown in FIG. 1B. In other embodiments, TR circuit 400 may instead be a transmit-only circuit or a receive-only circuit for use in an ESA. In further embodiments, TR circuit 400 may control multiple elements in addition to element 402.

During transmission, TR circuit 400 may receive a signal to be transmitted via an input 406. Input 406 may be one or more input lines connected to a signal source, such as a digital signal processor (DSP) or other electronic component configured to generate the signal to be transmitted. In one embodiment, input 406 may be connected to a power divider network, such as power divider network 114 shown in FIG. 1B, that connects input 406 and the signal source. For example, a communications signal that includes data to be transmitted may be provided to input 406 for transmission. In another example, a generated radar signal may be provided to input 406 to perform a radar sweep.

TR circuit 400 may perform various signal processing operations on a signal received via input 406 for transmission by element 402. In one embodiment, TR circuit 400 includes a phase shifter 408 configured to shift the phase of the signal, a variable amplitude controller 410 configured to adjust the amplitude of the signal, and a circulator 404 configured to route the signal to be transmitted to element 402. Circulator 404 may include three or more ports (e.g., a port connected to element 402, a port connected to variable amplitude controller 410, etc.) and limit the path that a signal may travel within circulator 404. For example, a signal being transmitted from the port of circulator 404 may only be routed to the port connected to element 402. Likewise, a signal received via the port connected to element 402 may route the received signal to phase shifter 416. In embodiments in which TR circuit 400 is a transmit-only or receive-only circuit, circulator 404 and the corresponding signal processing portions of TR circuit 400 may be omitted (e.g., circulator 404, variable amplitude controller 410, phase shifter 408, and input 406 may be omitted in a receive-only circuit).

Phase shifter 408 may be any form of digital or analog phase shifter that controllably applies a phase shift to the signal to be transmitted. In one embodiment, phase shifter 408 may divide the signal to be transmitted into its phase components. For example, phase shifter 408 may divide the signal into in-phase and quadrature component signals (e.g., I and Q component signals) that are separated by a ninety degree phase shift from one another. Phase shifter 408 may then apply different gains to the components of the input signal, to apply a phase shift. The gain-controlled signal components are recombined by phase shifter 408 to form the phase-shifted output signal. For example, elimination of the I component of a signal to be transmitted leaves only its Q component signal, thereby shifting the phase of the input signal by ninety degrees. According to one embodiment, phase shifter 408 may be an ultra-precision phase shifter, such as the one disclosed in the U.S. non-provisional patent application entitled, "ULTRA-PRECISION LINEAR PHASE SHIFTER WITH GAIN CONTROL," Ser. No. 13/714,209, filed on Dec. 13, 2012 by the same inventors as the present application, the entirety of which is hereby incorporated by reference. By controlling the phase of the signal transmitted via element 402 relative to those of the other elements of the ESA, the resulting beam may be directed. Phase shifter 408 provides its output signal to variable amplitude controller 410, which may adjust the amplitude of the signal before transmission by element 402.

To control the resulting radiation pattern of the ESA during transmission, variable amplitude controller 410 may adjust the amplitude of the signal to be transmitted via element 402. In some embodiments, variable amplitude controller 410 is an analog amplitude controller, thereby allowing for a continuous range of attenuation or gain that may be applied to the signal. In one embodiment, variable amplitude controller 410 is configured to minimize or eliminate any phase shifts that may result from its control over the signal's amplitude. Variable amplitude controller 410 may also exhibit limited phase variations over a range of different temperatures or supply power voltages to variable amplitude controller 410. Variable amplitude controller 410 may be configured such that its gain error is minimized, allowing for high precision control over the amplitude of the signal.

In one embodiment, phase shifter 408 and variable amplitude controller 410 are digitally controlled by a controller 412. Controller 412 may be, but is not limited to, a DSP, application-specific integrated circuit (ASIC), a general purpose processor, logic circuitry, combinations thereof, or any other processing circuit configured to generate control signals using stored machine instructions. In cases in which phase shifter 408 or variable amplitude controller 410 is an analog circuit, a digital control signal generated by controller 412 to control the analog circuit may first be converted by a digital-to-analog converter (DAC) 414. DAC 414 is configured to convert the received digital signals into analog control signals which may be used to control the amount of phase shift applied by phase shifter 408 or the gain applied by variable amplitude controller 410. DAC 414 may be a single converter configured to convert the digital control signal from controller 412 into digital form. Alternatively, DAC 414 may include two or more converters each configured to convert one or more bits of the digital control signal. For example, each bit of the digital control signal received from controller 412 may be converted by a separate converter in DAC 414. In another example, DAC 414 may include separate converters for each of variable amplitude controller 410 and phase shifter 408. In various embodiments, DAC 414 may use pulse width modulation, oversampling, binary weighting, or another conversion technique to convert the digital control signal into analog signals, in various embodiments. DAC 414 may also include logic circuitry (e.g., a logical encoder) used operate the various amplifiers and other components of phase shifter 408 and variable amplitude controller 410.

In cases in which variable amplitude controller 410 or phase shifter 408 is an analog circuit with a high degree of precision, the actual level of control over the applied amplitude change or phase shift may depend on the number of bits used in its respective control signal by controller 412. For example, a four bit control signal for phase shifter 408 may allow for phase shifts in 22.5° increments (e.g., 360°/16 possible control signals=22.5°). Variable amplitude controller 410 and phase shifter 408 may be configured to support any number of different size control signals. For example, the topology of phase shifter 408 may be scaled to support upwards of ten control bits, allowing for sub-degree control over the applied phase shift.

Similar to the transmitter portion of TR circuit 400, the receiver portion of TR circuit 400 may include a phase shifter 416 and variable amplitude controller 418. A signal received via element 402 may be routed by circulator 404 to the receives portion of TR circuit 400 to be phase-shifted and attenuated by phase shifter 416 and variable amplitude controller 418, respectively. The amplitude-adjusted and phase-adjusted signal may then be provided to a processing circuit for further processing via output 420. For example, a radar return signal received by element 402 may be analyzed by a DSP or other processor to detect the presence of nearby weather, terrain, or vehicles. In another example, a communications signal received by element 402 may be processed and converted into audio or video. In some embodiments, phase shifter 416 and variable amplitude controller 418 have the same or similar construction as phase shifter 408 and variable amplitude controller 410, respectively. For example, controller 412 and DAC 414 may provide control signals to phase shifter 416 and variable amplitude controller 418 in a manner similar to phase shifter 408 and variable amplitude controller 410. In a further embodiment, variable amplitude controller 410 and phase shifter 408 may be configured for use with both transmitted and received signals. The ordering of the phase shifters and amplitude controllers of TR circuit 400 may also be varied. For example, the amplitude of a signal may be adjusted before or after it is phase adjusted.

Figure 5:
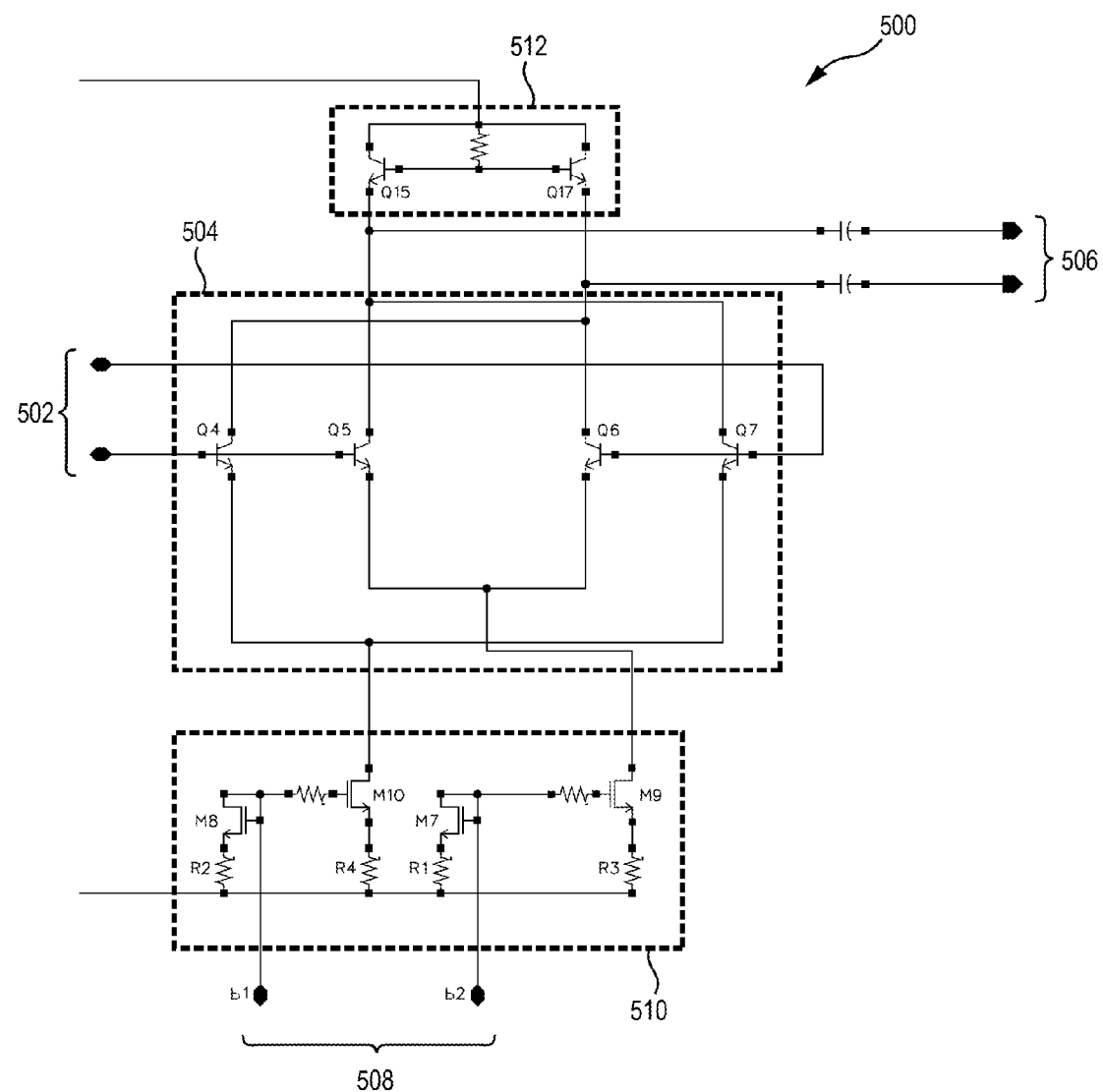
FIG. 5 is a circuit diagram of an amplitude controller, according to an exemplary embodiment.

Referring now to FIG. 5, a circuit diagram of an amplitude controller 500 is shown, according to an exemplary embodiment. As shown, amplitude controller 500 is a variable amplitude controller that allows for selectable control over the amount of attenuation or gain applied to an input signal (e.g., $V_{in}$) received at inputs 502. In some embodiments, amplitude controller 500 may be used to control the amplitude of a signal within an ESA. For example, amplitude controller 500 may be used in TR circuit 400 shown in FIG. 4 (e.g., as variable amplitude controller 410 or variable amplitude controller 418). In general, amplitude controller 500 includes a gain portion 504 configured to apply a gain or attenuation to an input signal received via inputs 502. The amount of gain or attenuation applied by gain portion 504 is based on a load portion 512 and the particular bias current supplied to gain portion 504 by a current mirror portion 510.

The input signal received at inputs 502 may be a differential signal (e.g., inputs 502 include separate lines for $V_{in}^+$ and $V_{in}^-$ signals whose difference is represented as the input signal $V_{in}$). The input signal may be provided by inputs 502 to a gain portion 504 of amplitude controller 500, which applies a gain or attenuation to the $V_{in}^+$ and $V_{in}^-$ signals. It is to be understood that attenuation is merely a negative gain and that amplitude controller 500 may be configured to apply either or both of a gain or attenuation to the input signal received at inputs 502. For example, the size ratio of transistors in load portion 512 and gain portion 504 may be such that a gain is applied by gain portion 504 at maximum settings and an attenuation is applied at lower settings (e.g., if the transistors in load portion 512 are undersized relative to those in gain portion 504). Other size ratios are also contemplated in other embodiments to control the overall gain or attenuation range of amplitude controller 500, as well as using resistive, inductive, or other forms of loads in load portion 510. The corresponding output signals from gain portion 504 and load portion 510 (e.g., the lines carrying the $V_{out}^+$ and $V_{out}^-$ signals that result from gain portion 504 adjusting the $V_{in}^+$ and $V_{in}^-$ signals under a load provided by load portion 510) are then provided to outputs 506, which carries the amplitude-adjusted signals as a differential output signal (e.g., $V_{out}$).

In some embodiments, gain portion 504 may include transistors or other circuit elements configured to apply gains or attenuations to the signals received at inputs 502. For example, gain portion 504 may include transistors Q4-Q7 configured to adjust the amplitudes of the signals received at inputs 502. As shown, the transistors in gain portion 504 may be cross-coupled with one another to provide differential gains to the input signals. For example, the emitters of transistors Q4, Q7 may be coupled and the emitters of Q5, Q6 may be coupled, thereby forming two transistor pairs (e.g., a first pair, Q4, Q7 and a second pair Q5, Q6). In other words, each transistor in an amplification stage of gain portion 504 may be cross coupled with a corresponding transistor in another amplification stage of gain portion 504. Each of the input lines at inputs 502 may be connected to a different transistor's base within the transistor pairs (e.g., the $V_{in}^+$ line is connected to the base of Q7 and the $V_{in}^-$ line is connected to the base of Q4). The collectors of a transistor pair may also be cross-coupled with those of the other pair as part of the differential output lines of outputs 506. For example, the collectors of transistors Q4 and Q6 may be coupled to form the $V_{out}^+$ line of outputs 506 and the collectors of transistors Q5, Q7 may be coupled to from the $V_{out}^-$ line of outputs 506.

According to some embodiments, transistors Q4-Q7 are transistors which have approximately linear transconductance to current characteristics. For example, the transistors in gain portion 504 may be bi-junction transistors (BJTs) or heterojunction BJTs (HBTs) that exhibit a transconductance relationship as follows:

$$g_m \cong \frac{I_c}{V_t}$$

where $g_m$ is the transconductance, $I_c$ is the current through the transistor's collector, and $V_t$ is the transistor's thermal voltage ($V_t$=k*T/q, which may be approximately equal to 26 mV at room temperature). The BJTs may be in NPN or PNP configurations, according to various embodiments. In other embodiments, the transistors of gain portion 504 may be field-effect transistors (FETs) or other circuit elements configured to apply controllable gains to the signals received via inputs 502. Since the transconductance varies linearly with the transistor's current, so too does the amplification provided by the transistor.

Amplitude controller 500 also include a current mirror portion 510 configured to control the gain or attenuation applied by gain portion 504 by applying varying currents across transistors Q4-Q7. As shown, current mirror portion 510 includes control lines 508 (e.g., control lines b1 and b2). Control lines 508 may be connected to Transistors M7-M10 in current mirror portion 510, which control the currents supplied to the emitters of transistors of gain portion Q4-Q7. Transistors M7-M10 may be HBTs, in one embodiment. In another embodiment, Transistors M7-M10 may be field effect transistors (FETs) which have zero DC gate current, allowing for lower power consumption. Transistors M7-M10 may also have resistors (e.g., R1-R4) connected to them respectively, to raise the common mode impedance at the drains of transistors M9-M10. In another embodiment, resistors R1-R4 may be omitted and a short used instead. Bias reference currents supplied by control lines 508 may be scaled up by current mirror portion 510 (e.g., based on the ratios between transistors M8/M10 and M7/M9 and their resistor ratios, if used). The scaled up currents may then be provided by current mirror portion 510 to transistors Q4-Q7 of gain portion 504. If the transconductances of transistors Q4-Q7 are proportional to the currents across them, transistors M8-M10 may be controlled to vary the amount of current supplied to gain portion 504 and, hence, the amount of amplitude control applied by gain portion 504. For example, the transistors in current mirror portion 510 may be controlled to prevent the supply of current into either of the sets of cross-coupled transistors in gain portion 504. In other words, control lines b1 and b2 may be used to activate the individual transistor pairs in gain portion 504 to provide current to transistors Q4-Q7, thereby controlling the transistors' respective gains. In various embodiments, control lines 508 may receive control signals from a control circuit (e.g., a DSP, ASIC, etc.) via one or more DACs. For example, control lines 508 may receive control signals from controller 412 and DAC 414 shown in greater detail in FIG. 4.

In one state of operation, current mirror portion 510 activates only one of the two transistor pairs in gain portion 504 (e.g., either pair Q5, Q6 or pair Q4, Q7). For example, transistors M8, M10 of current mirror portion 510 may be controlled via line b1 of control lines 508 such that no current is provided across transistors Q4, Q7. At the same time, transistors M7, M9 of current mirror portion 510 may be controlled to provide current across transistors Q5, Q6 (e.g., $I_{b1}=0$ and $I_{b2}=I_{bmax}$). Since the Q5, Q6 transistor pair is active, a gain may be applied equally to the $V_{in}^+$ and $V_{in}^-$ signals, thereby generating a maximized output signal $V_{out}$ at outputs 506. Such a state corresponds to one extreme of the operational range of amplitude controller 500 (e.g., the highest possible amplitude of $V_{out}$). In some cases, this may correspond to a gain being applied to $V_{in}$).

In another state of operation, current mirror portion 510 activates both of the two transistor pairs in gain portion 504 by providing currents to the respective transistor pairs. In such a case, maximum attenuation can be achieved in amplitude controller 500 when the gains of the two transistor pairs are equal, thereby canceling out the inputs signals from inputs 502. Since the gains of Q4-Q7 vary approximately linearly with their currents and the currents across them are also equal, their gains are also equal and the cross-coupling of Q4-Q7 at outputs 506 acts to cancel out the input signal. In other words, the maximum attenuation of the $V_{in}$ input signal by amplitude controller 500 can be achieved by controlling lines b1 and b2 in current mirror portion 510 such that equal amounts of current are supplied to the transistor pairs of gain portion 504. Such a state of operation also corresponds to the other extreme of the operational range of amplitude controller 500 (e.g., the total cancellation of the input signal). Thus, the amplitude control range of amplitude controller 500 varies from the condition in which only one transistor pair of gain portion 504 is active (e.g., a maximum output signal results) to the condition in which both transistor pairs of gain portion 504 have equal currents across them (e.g., a minimum output signal results).

According to various embodiments, amplitude controller 500 also includes a load portion 512. Load portion 512 generally operates to provide a constant voltage across the transistor pairs of gain portion 504 (e.g., and their corresponding output lines of outputs 506) despite voltage changes in $V_{in}$. Load portion 512 may include active or passive circuit elements to provide a load to gain portion 504 (e.g., resistors, an inductive choke, transistors, etc.), in various embodiments. As shown, for example, load portion 512 includes transistors Q15, Q17 which provide loads to transistors Q4-Q7 of gain portion 504. In one embodiment, transistors Q15, Q17 are of the same construction and type as the transistors of gain portion 504. For example, the transistors of load portion 512 and gain portion 504 may be silicon germanium (SiGe) based HBTs, in one implementation. In various embodiments, the size ratio of transistors Q15, Q17 in load portion 512 to transistors Q4-Q7 in gain portion 504 may be selected to adjust the overall range of amplitude control available from amplitude controller 500.

During operation, current mirror portion 510 may provide the total quiescent current in a transistor pair of gain portion 504. For example, transistors M8, M10 of current mirror portion 510 control the total current supplied to transistors Q4, Q7 of gain portion 504 and transistors M7, M9 of current mirror portion 510 control the total current supplied to transistors Q5, Q6 of gain portion 504. However, the actual current across each transistor in gain portion 504 may vary with $V_{in}$, since $V_{in}$ affects the balance of the current supplied to each transistor pair in gain portion 504. For example, if the voltage at the base of Q7 is higher than at the base of Q4, then transistor Q7 receives a larger percentage of the total current supplied via transistors M8, M10 of current mirror portion 510. As a result, the currents across the transistors or other elements of load portion 512 may compete with one another (e.g., since the current across Q15 is shared with Q5, Q7 of gain portion 504 and the current across Q17 is shared with Q4, Q6 of gain portion 504).

According to various embodiments, the load impedance of load portion 512 may be held constant across both of its transistors Q15, Q17 ($g_{m15}=g_{m17}$) or other elements (e.g., resistors, inductive choke, etc.) throughout the entire range of amplitude control provided by amplitude controller 500 based on the cross coupling of transistors Q4-Q7 and control over the currents supplied by control portion 510. In one embodiment, the amplitude control applied by amplitude controller 500 may be varied by increasing one of the currents supplied via M8, M10 or via M7, M9, while decreasing the other current in an equal amount. For example, the current supplied to line b1 of controls 508 may be decreased in an amount equal to an increase in current supplied to line b2 of controls 508. In such a case, each of the transistors or other elements in load portion 512 may receive the same amount of current across it, thereby also keeping their respective voltage drops constant. The constant voltage drops across load portion 512 also results in the voltages at the collectors of the transistors in gain portion 504 staying the same for all amplitude control conditions. For example, if transistors Q15, Q17 are used in load portion 512, their impedances at the emitters of Q4-Q7 are approximately $1/gm=1/(I_c/V_t)$, which remains constant across all control ranges of amplitude controller 500. As a result, the total transconductance of each of the combined transistors Q4/Q5 and Q6/Q7 is also held constant across the entire amplitude control range (e.g., $g_{m15}=g_{m17}=g_{m4}+g_{m5}=g_{m6}+g_{m7}$). While the gains of each individual transistor may change as a result of varying the currents supplied via current mirror portion 510, their combined proportions remain the same as a result of their cross-coupling and load portion 512. Since the overall gain is related to the combined transconductance of gain portion 504 (e.g., the combined transconductance of the transistor pairs in gain portion 504) times 1/gm of their respective load from load portion 512, the variable amplitude control of amplitude controller 500 is essentially only a function of the DC bias currents set up by $I_{b1}$, $I_{b2}$.

For example, a maximum amplitude output signal may be generated by supplying $I_{b1}=I_{bmax}$ and $I_{b2}=0$ to gain portion 504, leading to gm5=gm6=0 and gm4=gm7=$I_{bmax}/V_T$. At the other end of the control range of amplitude controller 500, the output signal may be completely eliminated (e.g., a maximum attenuation may be applied) by supplying $I_{b1}=I_{b2}=I_{bmax}/2$ to the transistor pairs, giving $g_{m4}=g_{m5}=g_{m6}=g_{m7}$, thereby causing the output signals from the cross-coupled transistors in gain portion 504 to cancel. The amount of amplitude control provided by amplitude controller 500 can be varied between a minimum and maximum by proportionately decreasing the current at one of b1, b2 and increasing the current at the other (e.g., $I_{b1}+\Delta I=I_{b2}-\Delta I$).

Since the transistors of amplitude controller 500 have optimum bias vs. frequency response characteristics, the bias current can be chosen to maximize its frequency response to offer a wide band of frequencies for the input signal received at inputs 502. For example, amplitude controller 500 may be capable of handling an input signal bandwidth of up to 20 GHz or more, when SiGe HBTs are used in gain portion 504 and load portion 512. Phase changes are also minimized by the topology of amplitude controller 500. For example, an input signal having a center frequency of 9.5 GHz may experience a phase shift of less than one degree across a range of gain variations up to 30 dBc.

In embodiments in which the transistors of gain portion 504 and load portion 512 have the same construction, temperature and supply power variations may also have minimal effects on the capabilities of amplitude controller 500. In some embodiments, the configuration of amplitude controller 500 may be such that its gain is related to the combined transconductance the transistors in gain portion 502 times 1/gm of their respective loads. Since $V_T$ of each transistor varies the same with the temperature, the amount of gain remains only a function of the currents provided by current mirrors 510. If SiGe HBTs are used for the transistors in portions 504, 512, for example, amplitude controller 500 may exhibit an absolute phase accuracy of approximately +/−2° over a temperature range of −40° C. to 85° C. For that same temperature range, amplitude controller 500 may also exhibit an absolute gain accuracy of approximately +/−0.8 dB. Even greater amplitude and phase accuracies may be accomplished using other analog circuit compensation techniques, according to other embodiments.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

What is claimed is:

1. An amplitude controller for providing minimal phase alteration across an amplitude control range comprising:
 a gain portion configured to receive an input signal, to apply a controllable amount of amplitude adjustment to the input signal across the amplitude control range, and to provide an amplitude-adjusted form of the input signal as an output signal, wherein the gain portion comprises at least two amplification stages, each of the amplification stages comprising branches that are cross-coupled with branches of the other of the amplification stages;
 a current mirror portion configured to control the controllable amount of amplitude adjustment applied by the gain portion by providing control currents to the amplification stages, a maximum of the amplitude control range corresponding to control current being supplied to one of the amplification stages, a minimum of the amplitude control range corresponding to equal control currents being supplied to the two amplification stages, wherein the amount of amplitude adjustment is varied between the minimum and maximum of the amplitude control range by increasing the control current to one of the amplification stages while decreasing the control current to the other of the amplification stages in an equal amount, wherein the control current to one of the amplification stages is controlled in response to a first signal provided to a first transistor gate in the current mirror portion and wherein the control current to the other of the amplification stages is controlled in response to a second signal provided to a second transistor gate in the current mirror portion, wherein the first signal is increased and the second signal is decreased proportionally with respect to the first signal to increase the current to one of the amplification stages while decreasing the control current to the other of the amplification stages in an equal amount; and
 a load portion connected to the two amplification stages and configured to provide balanced impedances to the cross-coupled branches of the amplification stages throughout the amplitude control range.

2. The amplitude controller of claim 1, wherein the cross-coupled branches of the amplification stages comprise cross-coupled transistors.

3. The amplitude controller of claim 2, wherein the output signal is provided via differential output lines, each differential output line being connected to a different set of cross-coupled branches of the amplification stages.

4. The amplitude controller of claim 3, wherein the load portion comprises two or more load transistors connected to the differential output lines.

5. The amplitude controller of claim 1, wherein the gain portion and the load portion are comprised of SiGe heterojunction bipolar transistors and each amplitude controller exhibits an absolute phase accuracy of + or −2 degrees over a temperature range of −40 degrees C. to 85 degrees C.

6. The amplitude controller of claim 1, wherein the cross-coupled transistors comprise field-effect transistors.

7. The amplitude controller of claim 1, wherein the current mirror portion comprises transistors connected to the two or more amplification stages and configured to control the control currents supplied to the amplification stages.

8. The amplitude controller of claim 1, further comprising a signal processing circuit configured to adjust the control currents supplied by the current mirror portion to the amplification stages of the gain portion via the first signal and the second signal.

9. An electronically scanned antenna array comprising:
a plurality of antenna elements configured to transmit a beam comprising signals emitted by the antenna elements; and
a plurality of amplitude controllers configured to adjust the amplitudes of signals provided to the antenna elements for emission, wherein each amplitude controller comprises:
a gain portion configured to receive an input signal, to apply a controllable amount of amplitude adjustment to the input signal across the amplitude control range, and to provide an amplitude-adjusted form of the input signal as an output signal, wherein the gain portion comprises two or more amplification stages, each of the amplification stages comprising branches that are cross-coupled with branches of the other of the amplification stages;
a current mirror portion configured to control the controllable amount of amplitude adjustment applied by the gain portion by providing control currents to the amplification stages, a maximum of the amplitude control range corresponding to control current being supplied to one of the amplification stages, a minimum of the amplitude control range corresponding to equal control currents being supplied to the amplification stages, wherein the amount of amplitude adjustment is varied between the minimum and maximum of the amplitude control range by increasing the control current to one of the cross-coupled amplification stages while decreasing the control current to the other of the amplification stages in an equal amount wherein the control current to one of the amplification stages is controlled in response to a first signal provided to a first transistor gate in the current mirror portion and wherein the control current to the other of the amplification stages is controlled in response to a second signal provided to a second transistor gate in the current mirror portion, wherein the first signal is increased and the second signal is decreased proportionally with respect to the first signal to increase the current to one of the amplification stages while decreasing the control current to the other of the amplification stages in an equal amount; and
a load portion connected to the two amplification stages and configured to provide balanced impedances to the cross-coupled branches of the amplification stages throughout the amplitude control range, wherein the load portion is comprised of SiGe heterojunction bipolar transistors and each amplitude controller exhibits an absolute phase accuracy of + or −2 degrees over a temperature range of −40 degrees C. to 85 degrees C.

10. The electronically scanned antenna array of claim 9, wherein the cross-coupled branches of the two amplification stages comprise cross-coupled transistors.

11. The electronically scanned antenna array of claim 10, wherein the output signal is provided via differential output lines, each differential output line being connected to a different set of cross-coupled branches of the amplification stages.

12. The electronically scanned antenna array of claim 11, wherein the load portion comprises two or more load transistors connected to the differential output lines.

13. The electronically scanned antenna array of claim 10, wherein the cross-coupled transistors comprise bipolar junction transistors.

14. The electronically scanned antenna array of claim 13, wherein the bipolar junction transistors are heterojunction bipolar transistors.

15. The electronically scanned antenna array of claim 9, wherein the load portion comprises passive circuit elements.

16. An electronically scanned antenna array comprising:
a plurality of antenna elements configured to transmit a beam comprising signals emitted by the antenna elements; and
a plurality of amplitude controllers configured to adjust the amplitudes of signals provided to the antenna elements for emission, wherein each amplitude controller comprises:
a gain portion configured to receive an input signal, to apply a controllable amount of amplitude adjustment to the input signal across the amplitude control range, and to provide an amplitude-adjusted form of the input signal as an output signal, wherein the gain portion comprises two or more amplification stages, each of the amplification stages comprising branches that are cross-coupled with branches of the other of the amplification stages;
a current mirror portion configured to control the amount of amplitude adjustment applied by the gain portion by providing control currents to the amplification stages, a maximum of the amplitude control range corresponding to control current being supplied to one of the amplification stages, a minimum of the amplitude control range corresponding to equal control currents being supplied to the amplification stages, wherein the amount of amplitude adjustment is varied between the minimum and maximum of the amplitude control range by increasing the control current to one of the cross-coupled amplification stages while decreasing the control current to the other of the amplification stages in an equal amount; and
a load portion connected to the two amplification stages and configured to provide balanced impedances to the cross-coupled branches of the amplification stages throughout the amplitude control range, wherein the gain portion and the load portion are comprised of SiGe heterojunction bipolar transistors and each amplitude controller exhibits an absolute phase accuracy of + or −2 degrees over a temperature range of −40 degrees C. to 85 degrees C.,
wherein the control current to one of the amplification stages is controlled in response to a first signal provided to a first transistor gate in the current mirror portion and wherein the control current to the other of the amplification stages is controlled in response to a second signal provided to a second transistor gate in the current mirror portion, wherein the first signal is increased and the second signal is decreased proportionally with respect to the first signal to increase the current to one of the amplification stages while decreasing the control current to the other of the amplification stages in an equal amount.

17. The electronically scanned antenna array of claim 16, further comprising a signal processing circuit configured to provide the first signal and the second signal to the transistors of the current mirror portion.

18. The electronically scanned antenna array of claim 16, further comprising a plurality of phase shifter configured to apply controllable phase shifts to the signals provided to the antenna elements, each phase shifter being connected to one of the plurality of amplitude controllers.

19. The electronically scanned antenna array of claim 16, further comprising a processing circuit configured to control the direction and shape of the transmitted beam by controlling the phase shifts by the phase shifters and the amount of amplitude adjustments by the amplitude controllers.

20. An amplitude controller for providing minimal phase alteration across an amplitude control range comprising:

gain means for applying a controllable amount of amplitude adjustment to a received input signal the gain means comprising at least two amplification stages, each of the amplification stages comprising branches that are cross-coupled with branches of the other of the amplification stages;

means for controlling currents supplied to the gain means to control the amount of amplitude adjustment, wherein the means for controlling current comprises a current mirror portion configured to control the controllable amount of amplitude adjustment applied by the gain means by providing control currents to the amplification stages, a maximum of the amplitude control range corresponding to control current being supplied to one of the amplification stages, a minimum of the amplitude control range corresponding to equal control currents being supplied to the two amplification stages; and load means for providing balanced impedances to the cross-coupled branches of the amplification stages throughout the amplitude control range, wherein the gain means and the load means are comprised of SiGe heterojunction bipolar transistors and the amplitude controller exhibits an absolute phase accuracy of + or −2 degrees over a temperature range of −40 degrees to 85 degrees C., wherein the amount of amplitude adjustment is varied between the minimum and maximum of the amplitude control range by increasing the control current to one of the amplification stages while decreasing the control current to the other of the amplification stages in an equal amount, wherein the control current to one of the amplification stages is controlled in response to a first signal provided to a first transistor gate in the current mirror portion and wherein the control current to the other of the amplification stages is controlled in response to a second signal provided to a second transistor gate in the current mirror portion, wherein the first signal is increased and the second signal is decreased proportionally with respect to the first signal to increase the current to one of the amplification stages while decreasing the control current to the other of the amplification stages in an equal amount.

\* \* \* \* \*